United States Patent [19]

Walston

[11] Patent Number: 5,322,974

[45] Date of Patent: Jun. 21, 1994

[54] INTERLEAVED FINE LINE CABLES

[75] Inventor: Don K. Walston, Tucson, Ariz.

[73] Assignee: International Business Machines Corporation, Armonk, N.Y.

[21] Appl. No.: 937,010

[22] Filed: Aug. 31, 1992

[51] Int. Cl.⁵ .............................. H05K 1/00
[52] U.S. Cl. ........................ 174/250; 174/254; 174/261; 361/749; 361/759; 439/67; 439/74
[58] Field of Search ............ 174/250, 254, 255, 256, 174/257, 258, 261; 361/412, 414, 749, 759; 439/67, 74

[56] References Cited

U.S. PATENT DOCUMENTS 4,981,336  1/1991  Mohan .
5,192,214  3/1993  Samarov et al. ............... 439/67

Primary Examiner—Leo P. Picard
Assistant Examiner—Cheryl R. Figlin
Attorney, Agent, or Firm—M. W. Schecter

[57] ABSTRACT

The invention is an interleaved electrical cable and a method of manufacture therefor. The cable is manufactured by interleaving the electrical traces of two cable subassemblies. Two cable subassemblies are manufactured and then bonded together with the traces of each subassembly interleaved with each other. The resulting interleaved fine line cable includes traces of a pitch less than that of either subassembly. Interleaved flexible cable subassemblies are also used to create the aforementioned traces of reduced pitch with one or more simple trace crossovers.

7 Claims, 4 Drawing Sheets

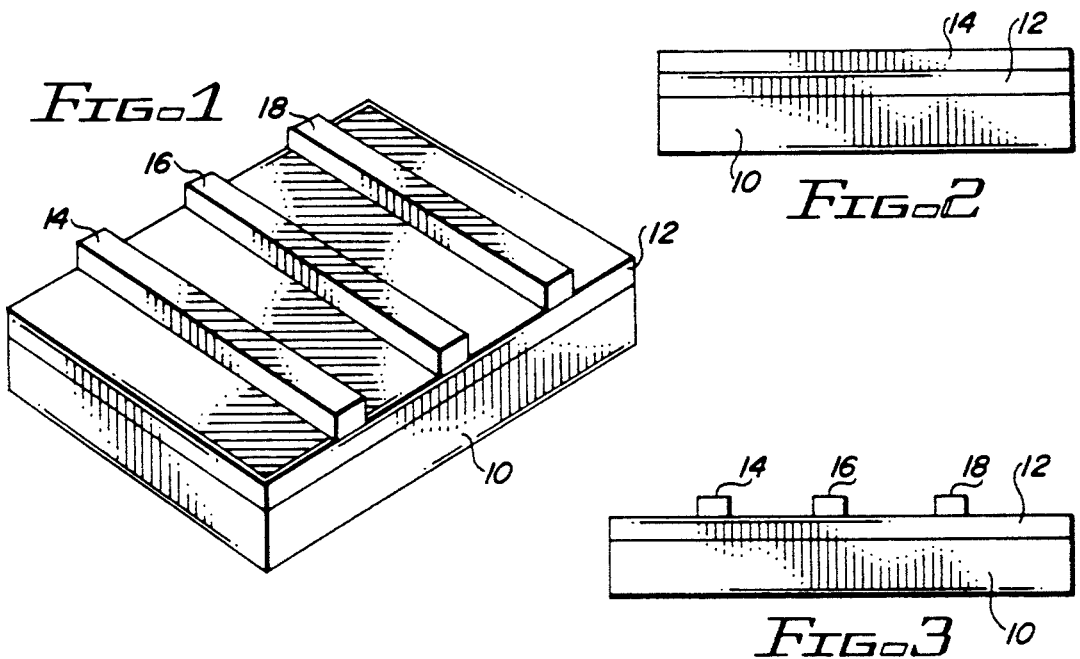
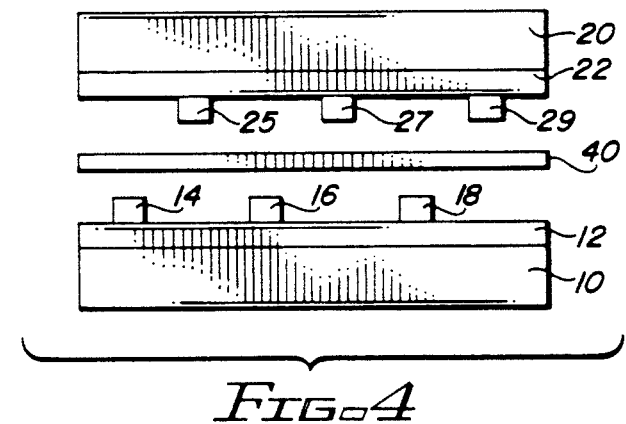
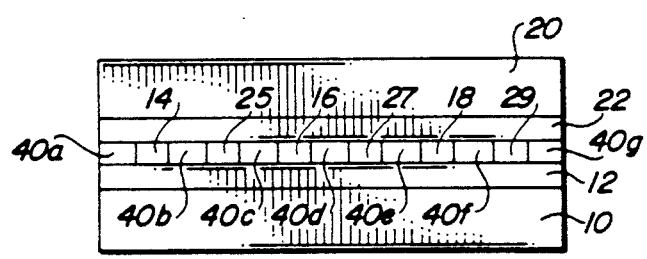

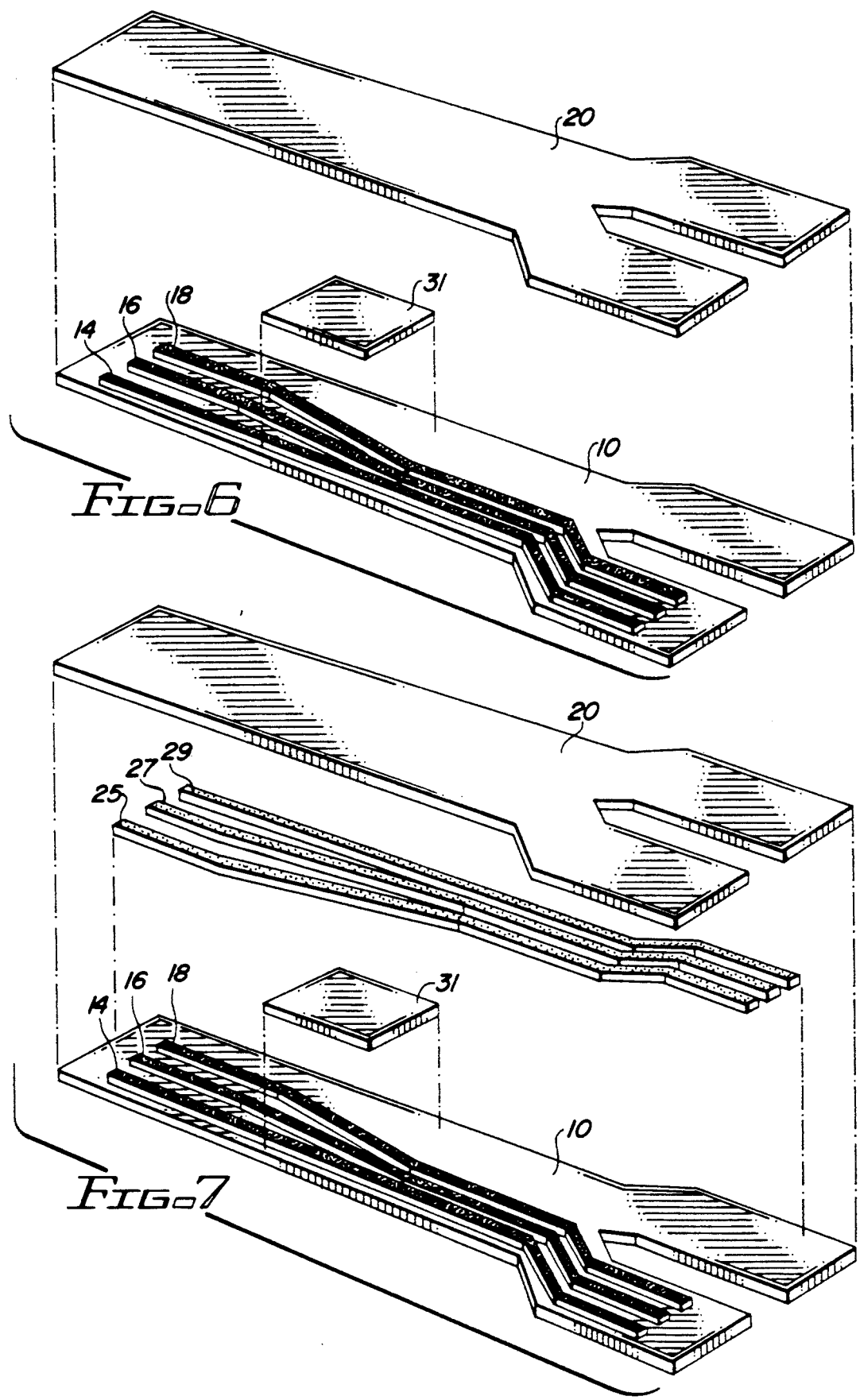

INTERLEAVED FINE LINE CABLES

BACKGROUND OF THE INVENTION

1. Field of the Invention

This invention relates to fine line electrical cables. More particularly, the invention relates to flexible, fine line electrical cables which are manufactured by interleaving two electrical cable subassemblies.

2. Description of the Related Art

Electronic components often include flexible electrical cables for directing electricity to various subcomponents. Such flexible electrical cables are typically manufactured by creating electrical circuit traces etched from copper clad laminates and/or copper bond to a flexible substrate. A flexible insulating material such as polyimide is often selected as the substrate. A sheet of conductive material is laminated to the flexible substrate by using an adhesive such as phenolic butyral, acrylic or modified epoxy. Electrical traces are created in the conductive material lithographically. A photoresist is intimately placed upon the conductive material, exposed through a mask, and then the undeveloped photoresist is selectively removed from the areas between the desired traces. A chemical etchant which is relatively active upon the conductive material, but relatively inactive upon the photoresist, is then used to selectively remove the conductive material from the areas between the desired traces. The remaining photoresist is then stripped away, leaving only the substrate, adhesive, and the pattern of conductive traces thereon. The pattern is typically a set of parallel traces. A second layer of insulating material is then placed upon the conductive traces to completely insulate them, using additional adhesive as required.

Another known method of manufacturing flexible electrical cables begins with the deposition of an interface layer, such as chromium, upon a flexible substrate, such as polyimide. A thin layer of conductive material, such as copper is then deposited upon the interface layer. The interface layer and the conductive material may be deposited by sputtering. The interface layer ensures that the conductive material adequately adheres to the flexible substrate. Electrical traces are created lithographically. A photoresist is intimately place upon the thin layer of conductive material, exposed through a mask, and then the underdeveloped photoresist is selectively removed from the areas of the desired traces. A thick layer of the same conductive material is plated into the areas of the desired traces and the remaining photoresist is stripped away. The interface layer and thin layer of conductive material are then removed by chemical etching down to the substrate in the space between the thick conductive layer areas of the desired traces. The remaining electrical traces are thus composed of three layers added to the flexible substrate. Again, a second layer of insulating material is then placed upon the conductive traces to completely insulate them.

The aforementioned methods of manufacture are acceptable for many flexible electrical cable applications. However, the spacing between adjacent traces is limited by the resolution of the lithographic techniques used to remove the conductive material therebetween. Modern electronic components require increased concentrations of electrical traces (i.e. decreased spacing between traces). Thus, a heretofore unrecognized problem is how to achieve electrical traces in flexible cables at spacings less than those made possible by the resolution of the lithography technology.

Occasionally it is necessary to cross traces in flexible circuit cables. The crossed traces must be insulated from each other to prevent electrical shorting. Additional layers of conductive and insulating material are typically used to cross the traces. After the aforementioned patterning of the traces and stripping of the photoresist, additional patterning is used to raise a trace into another plane to allow for the crossover. Similar patterning may also be used to return the raised trace to its original plane. Such additional layers of material and patterning make the manufacture of the flexible electrical cables more complex, time consuming, and expensive. Such additional patterning may also include the use of conductive thru holes which employ plating, riveting, or other techniques to electrically connect two planes. Thru holes cannot be manufactured to have a diameter the same or less than the minimum electrical trace width made possible by the resolution of the lithography technology. The use of thru holes, therefore, increases the permissible width and spacing of electrical traces. Thus, another heretofore unrecognized problem is how to achieve simple trace crossovers in flexible electrical cables.

SUMMARY OF THE INVENTION

The present invention is an interleaved electrical cable and a method of manufacture therefor. The cable is manufactured by interleaving the electrical traces of two cable subassemblies. To manufacture a cable, a first sheet of conductive material is bonded to a first flexible substrate and a second sheet of conductive material is bonded to a second flexible substrate. Next, both sheets are lithographically patterned to create a first cable subassembly including a first set of conductive traces on the first flexible substrate and a second cable subassembly including a second set of conductive traces on the second flexible substrate. The two subassemblies are then positioned opposite each other with the traces on each substrate facing the other subassembly, and with a sheet of adhesive therebetween. The subassemblies are then bonded together with the traces on each substrate interleaved with each other. The resulting interleaved fine line cable includes traces of a pitch less than that of either subassembly, thereby achieving electrical traces at spacings less than those made possible by the resolution of the lithographic technology. The interleaved traces are sandwiched between and insulated by the flexible substrates.

The present invention also contemplates an interleaved electrical cable including one or more simple trace crossovers and a method of manufacture therefor. First and second flexible subassemblies are manufactured as previously described, except for the particular trace pattern. The subassemblies are then bonded together with the two sets of traces separated by a spacer in a region permitting simple trace crossovers. The resulting interleaved fine line cable includes the aforementioned traces of reduced pitch, and also one or more simple trace crossovers. Again, the traces are sandwiched between and insulated by the flexible substrates.

The foregoing and other objects, features, and advantages of the invention will be apparent from the following more particular description of the preferred embodiment of the invention, as illustrated in the accompanying drawing.

BRIEF DESCRIPTION OF THE DRAWING

FIG. 1 is an isometric view of an electrical cable subassembly according to the invention.

FIG. 2 is a side view of the subassembly of FIG. 1.

FIG. 3 is an end view of the subassembly of FIG. 1.

FIG. 4 is an end view of two spaced, opposed electrical cable subassemblies, including the subassembly of FIG. 1, with a sheet of adhesive therebetween.

FIG. 5 is an end view of an interleaved electrical cable manufactured from the subassemblies of FIG. 4.

FIG. 6 is an exploded, isometric view of an interleaved electrical cable, including a trace crossover.

FIG. 7 is an exploded, isometric view of the interleaved electrical cable of FIG. 6 with the second set of traces separated from the second substrate to reveal the alignment of the first and second set of traces.

DESCRIPTION OF THE PREFERRED EMBODIMENT

Figure 8:
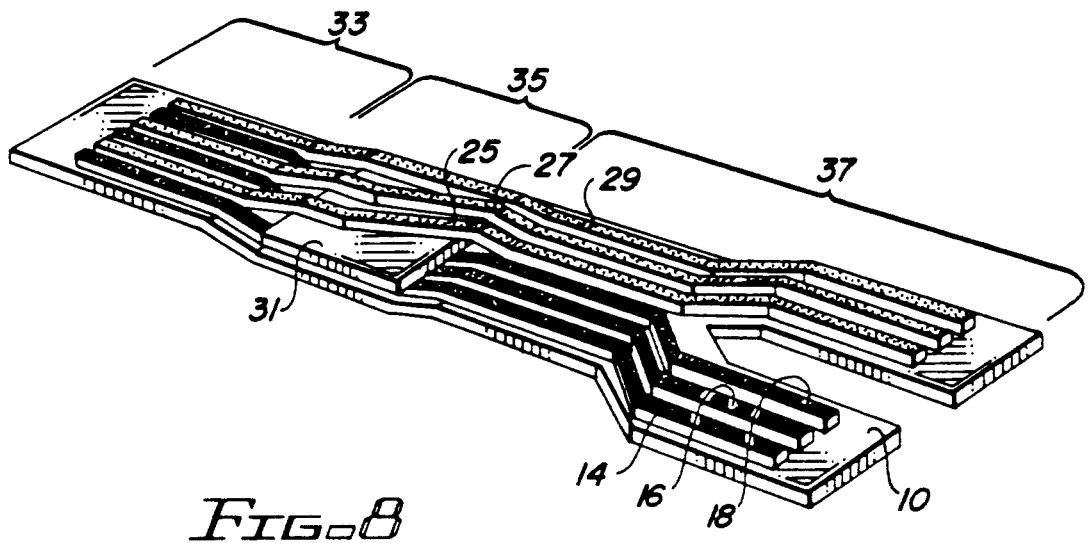
FIG. 8 is an isometric view of the interleaved electrical cable of FIG. 6 with the second flexible substrate removed to reveal the electrical traces.

Referring now more particularly to the drawing, like numerals denote like features and structural elements in the various figures. Referring to FIGS. 1–3, a cable subassembly will now be described. The cable subassembly includes a flexible substrate 10, an adhesive 12, and electrical traces 14, 16 and 18. Flexible substrate 10 is an insulator such as polyimide. Traces 14, 16 and 18 are manufactured from a conductor such as copper. Adhesive 12 is any adhesive suitable for bonding traces 14, 16 and 18 to substrate 10. For example, copper may be bonded to polyimide using modified epoxy, acrylic, or butyral phenolic adhesives.

The cable subassembly is manufactured using lithographic techniques known to one of skill in the art. First, adhesive 12 is laminated to substrate 10. A sheet of conductive material is then laminated to adhesive 12 to bond it to substrate 10. A photoresist is then intimately placed upon the conductive material, exposed through a mask, and then the undeveloped photoresist is selectively removed from the areas between the desired traces. A chemical etchant which is relatively active upon the conductive material, but relatively inactive upon the photoresist, is then used to selectively remove the conductive material from the areas between the desired traces. The remaining photoresist is then stripped away, leaving only substrate 10, adhesive 12, and traces 14, 16 and 18 thereon. Any number of traces may be created, traces 14, 16 and 18 are merely exemplary.

Referring to FIG. 4, two cable subassemblies will now be described. The first cable subassembly is that shown in FIGS. 1–3, and is manufactured as previously described. The second cable assembly includes a second flexible substrate 20 and a second set of traces 25, 27 and 29 bonded to substrate 20 by an adhesive 22. The materials and manufacturing technique are the same as for the first cable subassembly. As shown, the two cable subassemblies are positioned with their respective traces facing the other subassembly, and with a sheet of adhesive 40 therebetween. The lithographic patterning of the traces on the subassemblies and/or the positioning of the subassemblies is such that traces 14, 16 and 18 of the first subassembly do not directly oppose traces 25, 27 and 29 of the second subassembly. In addition, the geometry of the cross-section of each electrical trace may not be rectangular, as shown in the figures, depending upon the lateral action of the etchant.

Referring to FIG. 5, the two subassemblies are then bonded together with the traces on each flexible substrate interleaved with each other. The resulting interleaved fine line cable includes traces 14, 25, 16, 27, 18 and 29 sandwiched between and insulated by substrates 10 and 20. Adhesive layers 12 and 22, and several adhesive pockets 40a–40g (adhesive 40 after bonding), bond the structure together. Note that thin layers of adhesive 40 remain between the electrical traces and adhesive layers 12 and 22, but are not shown in FIG. 5 for convenience. At each end of the fine line cable the traces may be electrically connected to other electronic subcomponents, including other cables, to direct electricity therebetween.

The pitch of the traces refers to the distance between adjacent trace centers. Thus, the pitch of the first subassembly is the distance between the center of trace 16 and the center of trace 18. It is desirable to minimize the pitch to maximize the density of traces per unit area. Such minimization is limited by the resolution of the lithographic techniques used to create the traces. Assuming that the pitch of each subassembly in FIG. 4 is so minimized, the pitch of the interleaved fine line cable of FIG. 5 is reduced still further. The pitch of such cable is not the distance between trace centers from the same subassembly (such as that between traces 16 and 18, or between traces 27 and 29), but the distance between adjacent trace centers in the final assembly (such as that between traces 16 and 27). Thus, electrical trace spacings less than those made possible by simply lithographic techniques are achieved.

The present invention also contemplates an interleaved electrical cable including one or more simple trace crossovers and a method of manufacture therefore. No thru holes are used. Referring to FIGS. 6–8, such a cable will now be described. First and second flexible subassemblies are manufactured as previously described. The first flexible subassembly includes the substrate 10 and three traces 14, 16 and 18 patterned as shown in FIGS. 7–8. The second flexible subassembly includes the substrate 20 and three traces 25, 27 and 29 patterned as shown in FIGS. 7–8. The adhesives are not shown for convenience.

The first and second subassemblies are then bonded together to sandwich the traces between the flexible substrates with first traces 14, 16 and 18 separated from second traces 25, 27 and 29 by a third spacer substrate 31 in a region 35 of the cable, as shown in FIG. 8. Substrate 20 is removed from traces 25, 27 and 29 to reveal the inner structure of the cable. The traces shown are of a slightly different pattern in region 35 because of the conductor geometry which occurs during manufacture. The resulting interleaved fine line cable includes the aforementioned interleaved traces of reduced pitch in a region 33 of the cable, and also one or more simple trace crossovers. A cable region 37 is shown with non-interleaved traces, but could also be interleaved depending upon the crossover pattern in region 35. For example, the crossover pattern in region 35 could be such that the relative positions of traces 18 and 25 are reversed in region 37.

Figure 9:
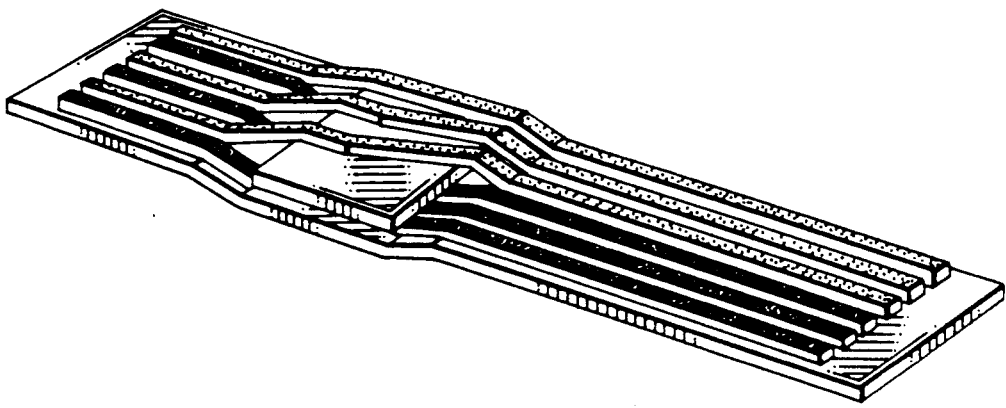
FIG. 9 is an isometric view of an interleaved electrical cable, including a trace crossover, with the second flexible substrate removed and without the Y-shaped region.

Cable region 37 of FIGS. 6–8 includes a Y-shape. Such Y-shape permits further separation of the traces at the split end of the cable. Because the substrates are flexible, the individual pieces of the cable at the split end of the cable may actually be bent into different directions. In the alternative, if such further separation is unnecessary, a cable may be manufactured with one or more simple trace crossovers but without the Y-shape. Such an alternative embodiment of the cable is shown in FIG. 9 (again without the adhesives).

Figure 10:
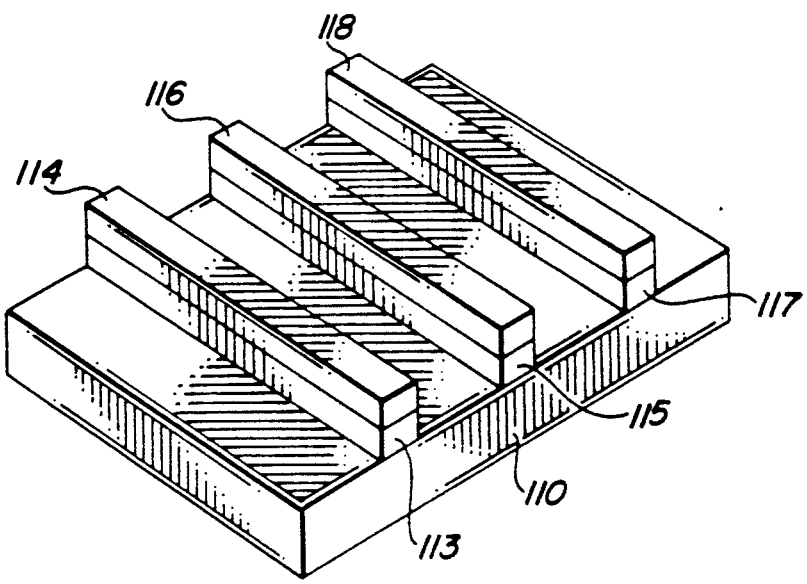
FIG. 10 is an isometric view of an electrical cable subassembly according to an alternate embodiment of the invention as shown in FIG. 1.
Figure 11:
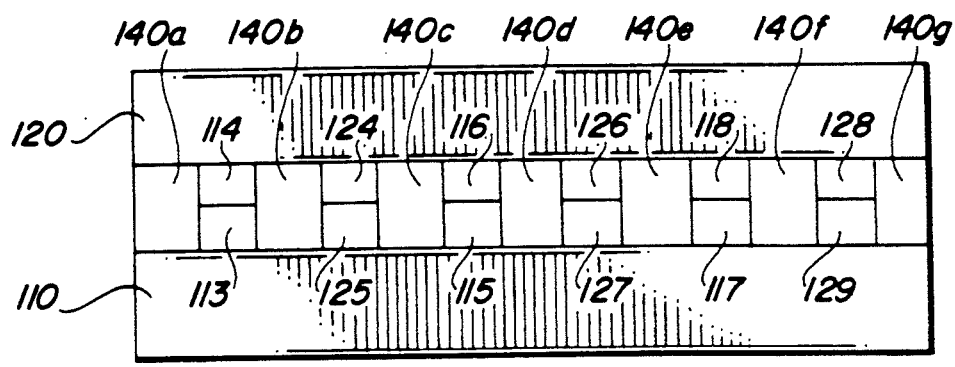
FIG. 11 is an end view of an interleaved electrical cable manufactured from subassemblies shown in FIG. 1.

Referring to FIGS. 10 and 11, an alternative embodiment of the invention will now be described. The alternate embodiment is similar to that already described, but employs cable assemblies manufactured according to a known additive method. The cable subassembly shown in FIG. 10 is manufactured by first depositing a layer of chromium upon a polyimide substrate 110. A thin layer of copper is deposited upon substrate 110. A photoresist is intimately placed upon the thin layer of copper, exposed through a mask, and the developed photoresist is selectively removed from the areas of the desired traces. A thick layer of copper is plated into the areas of the desired traces and the remaining photoresist is stripped away. The chromium and thin layer of copper are then removed by chemical etching down to substrate 110 in the space between the thick copper layer areas of the desired traces. The remaining electrical traces are thus composed of the remains 113, 115, and 117 of the chromium and the remains 114, 116, and 118 of the copper layers.

As shown in FIG. 11, two such subassemblies may again be bonded together with the traces on each flexible substrate interleaved with each other. The second subassembly includes a substrate 120, chromium 124, 126, and 128, and copper 125, 127, and 129. A suitable adhesive 140a–140g is used to bond the structure together. Interleaved electrical cables including one or more trace crossovers may also be created, as previously described with respect to FIGS. 6–9.

While the invention has been described with respect to a preferred embodiment thereof, it will be understood by those skilled in the art that various changes in detail may be made therein without departing from the spirit, scope, and teaching of the invention. For example, the cable subassemblies may be of varying dimensions and include any number of traces thereon. Also, the traces need not be interleaved in a pattern of alternating traces from each subassembly, but may be interleaved in other patterns as well (such as alternating pairs of traces from each subassembly, two traces from the first subassembly interleaved with individual traces from the second subassembly, etc.). Finally, the interleaved cable may include a varying number of trace crossovers and each trace may be crossed over any number of other traces. Accordingly, the invention disclosed herein is to be limited only as specified in the following claims.

What is claimed is:

1. A fine line electrical cable comprising:
a first subassembly having a first plurality of electrical traces on a first substrate and a second subassembly having a second plurality of electrical traces on a second substrate; and
an adhesive bonding the first and second subassemblies together with the first and second pluralities of electrical traces sandwiched between the first and second substrates, the first plurality of electrical traces interleaved with the second plurality of electrical traces, the adhesive located between adjacent electrical traces.

2. The cable of claim 1 wherein each subassembly comprises
a sheet of a conductive material bonded to a substrate.

3. The cable of claim 2 wherein the first and second substrates are polyimide and the conductive material is copper.

4. The cable of claim 1 wherein the first and second substrates are polyimide and the conductive material is copper.

5. A flexible electrical cable having an electrical trace crossover comprising:
a first subassembly having a first plurality of electrical traces on a first flexible substrate, the first subassembly having a first, a second, and a third region along its length, the second region of the first subassembly between the first and third regions of the first subassembly, the first plurality of electrical traces extending continuously from the first region to the third region of the first subassembly;
a second subassembly having a second plurality of electrical traces on a second flexible substrate, the second subassembly having a first, a second, and a third region along its length, the second region of the second subassembly between the first and third regions of the second subassembly, the second plurality of electrical traces extending continuously from the first region to the third region of the second subassembly; and
a third flexible substrate, the first regions of the first and second subassemblies bonded together with the first plurality of electrical traces interleaved with the second plurality of electrical traces, the second regions of the first and second subassemblies bonded together with the third flexible substrate interposed between the first plurality of electrical traces and the second plurality of electrical traces, at least one electrical trace from the first plurality of electrical traces and at least one electrical trace from the second plurality of electrical traces being of substantially constant thickness and laterally reversed between the first and third regions of the first and second subassemblies.

6. A flexible electrical cable having an electrical trace crossover comprising:
a first subassembly having a first plurality of electrical traces on a first flexible substrate, the first subassembly having a first, a second, and a third region along its length, the second region of the first subassembly between the first and third regions of the first subassembly, the first plurality of electrical traces extending continuously from the first region to the third region of the first subassembly, the first subassembly manufactured by lithographically creating the first plurality of electrical traces on the first substrate;
a second subassembly having a second plurality of electrical traces on a second flexible substrate, the second subassembly having a first, a second, and a third region along its length, the second region of the second subassembly between the first and third regions of the second subassembly, the second plurality of electrical traces extending continuously from the first region to the third region of the second subassembly, the second subassembly manufactured by lithographically creating the second plurality of electrical traces on the second substrate; and a third flexible substrate, the cable manufactured by the method including the steps of:
bonding the first region of the first subassembly to the first region of the second subassembly with the first plurality of electrical traces interleaved with the second plurality of electrical traces; and
bonding the second region of the first subassembly to the second region of the second subassembly with a third flexible substrate interposed between the first plurality of electrical traces and the second plurality of electrical traces, at least one electrical trace from the first plurality of electrical traces and at least one electrical trace from the second plurality of electrical traces being of substantially constant thickness and laterally reversed between the first and third regions of the first and second subassemblies.

7. The cable of claim 1 wherein the adhesive is located between adjacent electrical traces, between the first plurality of electrical traces and the second subassembly, and between the second plurality of electrical traces and the first subassembly.

* * * * *